United States Patent
Sun et al.

(10) Patent No.: US 8,727,826 B2
(45) Date of Patent: May 20, 2014

(54) DONOR SUBSTRATE, METHOD OF MANUFACTURING A DONOR SUBSTRATE AND A METHOD OF MANUFACTURING AN ORGANIC LIGHT EMITTING DISPLAY DEVICE USING A DONOR SUBSTRATE

(75) Inventors: Jin-Won Sun, Yongin (KR); Heung-Yeol Na, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 13/455,117

(22) Filed: Apr. 24, 2012

(65) Prior Publication Data
US 2013/0023179 A1      Jan. 24, 2013

(30) Foreign Application Priority Data
Jul. 19, 2011    (KR) .................. 10-2011-0071380

(51) Int. Cl.
*H01J 9/00*      (2006.01)
(52) U.S. Cl.
USPC ........................................ 445/24; 156/540
(58) Field of Classification Search
CPC ............ H01L 51/0013; H01L 51/0001; H01L 51/0002
USPC ................. 445/24–25; 156/540; 438/46, 758; 428/32.8; 427/146; 257/192
See application file for complete search history.

(56) References Cited

U.S. PATENT DOCUMENTS

| | | | | |
|---|---|---|---|---|
| 2007/0257276 | A1* | 11/2007 | Kwon et al. | 257/192 |
| 2008/0309230 | A1* | 12/2008 | Yang et al. | 313/504 |
| 2010/0048084 | A1* | 2/2010 | Pyo et al. | 445/23 |
| 2013/0004753 | A1* | 1/2013 | Majumdar et al. | 428/209 |

FOREIGN PATENT DOCUMENTS

| | | |
|---|---|---|
| JP | 2008-133102 | 6/2008 |
| JP | 2010-050313 | 3/2010 |
| JP | 2010-143737 | 7/2010 |

\* cited by examiner

*Primary Examiner* — Anne Hines
(74) *Attorney, Agent, or Firm* — Christie, Parker & Hale, LLP

(57) ABSTRACT

A donor substrate may include a base substrate, a light-to-heat conversion layer, a transfer layer, and a rib structure. The light-to-heat conversion layer may be on the base substrate. The transfer layer may be on the light-to-heat conversion layer. The rib structure is on the transfer layer. The rib structure may include a plurality of tubes spaced apart from one another. In a laser induced thermal imaging process, the donor substrate including the rib structure may be easily removed from a display substrate without damage, thereby to form an organic layer pattern regularly on the display substrate.

25 Claims, 11 Drawing Sheets

DONOR SUBSTRATE, METHOD OF MANUFACTURING A DONOR SUBSTRATE AND A METHOD OF MANUFACTURING AN ORGANIC LIGHT EMITTING DISPLAY DEVICE USING A DONOR SUBSTRATE

CROSS-REFERENCE TO RELATED APPLICATION

This application claims priority under 35 U.S.C. §119 to Korean patent Application No. 2011-0071380, filed on Jul. 19, 2011, the disclosure of which is hereby incorporated by reference herein in its entirety.

BACKGROUND

1. Field

Example embodiments of the present invention relate to donor substrates, methods of manufacturing donor substrates, and methods of manufacturing organic light emitting display devices using donor substrates.

2. Description of Related Art

Generally, organic light emitting display devices may include various organic layers such as an organic light emitting layer, a hole injection layer, an electron transfer layer, etc. Among processes for forming the organic layers of conventional organic light emitting display devices, an ink-jet printing process may use limited amount of materials for forming the organic layers except the light emitting layer, and an additional structure may be formed on a substrate for the ink-jet printing process. When using a deposition process for forming organic layers, it may be difficult to apply the deposition process to the organic light emitting display device having a relatively large area because the deposition process may use a micro-dimensioned metal mask.

Recently, a laser induced thermal imaging process has been developed for forming organic layers of the organic light emitting display device. In a conventional laser induced thermal imaging process, energy of a laser beam from a laser irradiation apparatus may be converted to a thermal energy, and an organic layer of a donor substrate may be partially transferred onto a display substrate of the organic light emitting display device by the thermal energy, thereby forming an organic layer pattern. In order to form the organic layer pattern by the laser induced thermal imaging process, the donor substrate including a transfer layer, the laser irradiation apparatus, and/or the display substrate may be used. For example, the donor substrate and the display substrate may be adhered to each other, and the laser induced thermal imaging process may be performed to form the organic layer pattern on the display substrate from the transfer layer. However, in a conventional laser induced thermal imaging process, when the donor substrate is removed from the display substrate after a transfer process of the transfer layer by using the thermal energy, the organic layer pattern on the display substrate may be damaged. For example, when the donor substrate is removed from the display substrate, the organic layer pattern on the display substrate may be partially or entirely torn off, so that a pixel failure of the organic light emitting display device may occur.

SUMMARY

Example embodiments of the present invention are directed toward donor substrates including rib structures, the donor substrates being removable from display substrates without generating a pixel failure.

Example embodiments of the present invention are directed toward methods of manufacturing donor substrates including rib structures, the donor substrates being removable from display substrates without generating a pixel failure.

Example embodiments of the present invention are directed to methods of manufacturing organic light emitting display devices capable of preventing or reducing a pixel failure by employing donor substrates including rib structures.

According to example embodiments, there is provided a donor substrate including a base substrate, a light-to-heat conversion layer, a transfer layer, and a rib structure. The light-to-heat conversion layer may be on the base substrate. The transfer layer may be on the light-to-heat conversion layer. The rib structure may be on the transfer layer. The rib structure may include a plurality of tubes spaced apart from one another.

In example embodiments, the tubes may include a plurality of openings at at least one of upper portions or side portions of the tubes.

In example embodiments, the rib structure may further include at least one connection tube connected to end portions of the tubes.

In example embodiments, the at least one connection tube may include a material that is substantially the same as that of the tubes.

In example embodiments, the at least one connection tube may be integrally formed with the tubes.

In example embodiments, the at least one connection tube may include a first connection tube and a second connection tube. The first connection tube may be connected to first end portions of the tubes. The second connection tube may be connected to second end portions of the tubes.

In example embodiments, the rib structure may include a plurality of first tubes and a plurality of second tubes. The first tubes may extend in a first direction. The second tubes may extend in a second direction.

In example embodiments, the first tubes and the second tubes may be arranged in a matrix shape.

In example embodiments, the first tubes may include a plurality of first openings at at least one of upper portions or side portions of the tubes. The second tubes may include a plurality of second openings at at least one of upper portions or side portions of the tubes.

In example embodiments, at least one of the first tubes at a central portion of the transfer layer may include a plurality of first openings at at least one of upper portions or side portions of the tubes. At least one of the second tubes in the central portion of the transfer layer may include a plurality of second openings at at least one of upper portions or side portions of the tubes.

In example embodiments, the rib structure may further include partition walls in at least one of the first tubes or the second tubes.

In example embodiments, the tubes may include silicon, urethane, or aluminum.

In example embodiments, a ratio between heights and widths of the tubes may be between about 1.0:0.5 and about 1.0:1.0.

According to example embodiments, there is provided a method of manufacturing a donor substrate. In the method, a light-to-heat conversion layer may be formed on a base substrate. A transfer layer may be formed on the light-to-heat conversion layer. A rib structure including a plurality of tubes spaced apart from one another may be formed on the transfer layer.

In example embodiments, forming the rib structure may further include forming a plurality of openings at at least one of upper portions or side portions of the tubes.

In example embodiments, forming the rib structure may further include forming at least one connection tube connected to end portions of the tubes.

In example embodiments, wherein forming the rib structure may further include forming first grooves on a plurality of first tubes of the tubes, forming second grooves on a plurality of second tubes of the tubes, and combining the first tubes with the second tubes by aligning the first grooves with the second grooves.

In example embodiments, wherein forming the rib structure further may include arranging a plurality of first tubes of the tubes on the transfer layer along a first direction and arranging a plurality of second tubes of the tubes on the transfer layer along a second direction. The second tubes may intersect the first tubes.

In example embodiments, forming the rib structure may further include forming partition walls in at least one of first tubes or second tubes of the plurality of tubes.

According to example embodiments, there is provided a method of manufacturing an organic light emitting display device. In the method, a rib structure may be formed on a base substrate to manufacture a donor substrate. The rib structure may include a plurality of tubes. The base substrate may include a light-to-heat conversion layer and a transfer layer. The donor substrate may be laminated onto a display substrate. A laser beam may be irradiated on the donor substrate, thereby to form an organic layer pattern on the display substrate from the transfer layer. Gases may be released between the display substrate and the donor substrate through the rib structure, thereby to remove the donor substrate from the display substrate.

In example embodiments, forming a rib structure may include arranging a plurality of tubes on the transfer layer, the tubes being spaced apart from one another and forming a plurality of openings at at least one of upper portions or side portions of the tubes.

In example embodiments, the tubes may be spaced apart from one another at a distance, and the distance may be about the same as an integer multiple of a width of a pixel region of the display substrate.

In example embodiments, forming the rib structure may further include forming at least one connection tube connected to end portions of the tubes.

In example embodiments, forming the rib structure may further include arranging a plurality of first tubes on the transfer layer, the first tubes being spaced apart from one another at a first distance, and arranging a plurality of second tubes on the transfer layer, the second tubes being spaced apart from one another at a second distance.

In example embodiments, the first distance may be about the same as an integer multiple of at least one of a horizontal width or a vertical width of a pixel region of the display substrate, and the second distance may be about the same as an integer multiple of at least one of a horizontal width or a vertical width of a pixel region of the display substrate According to example embodiments, when a donor substrate is removed from a display substrate, a donor substrate including a rib structure containing a plurality of tubes may be employed. Therefore, the donor substrate may be easily removed without causing damage to the display substrate, thereby to form an organic layer pattern regularly on the display substrate. As a result, a pixel failure of the organic light emitting display device including the display substrate may be prevented or reduced.

BRIEF DESCRIPTION OF THE DRAWINGS

Example embodiments of the present invention may be understood in more detail from the following description taken in conjunction with the accompanying drawings, in which.

DETAILED DESCRIPTION OF EMBODIMENTS

Figure 1:
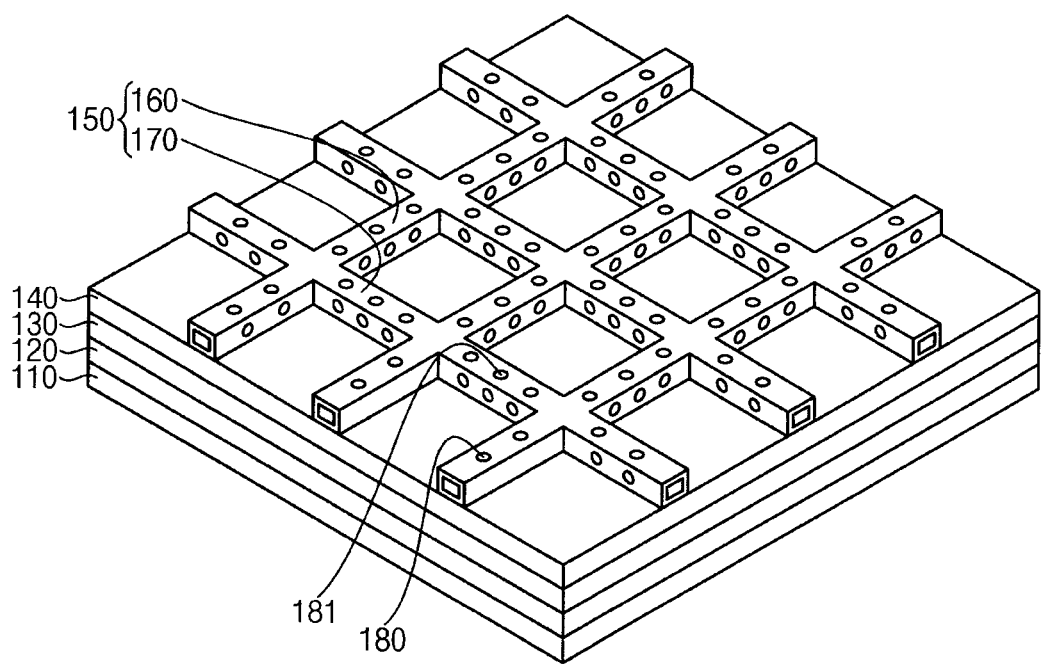
FIG. 1 is a perspective view illustrating a donor substrate in accordance with example embodiments.

Example embodiments of the present invention will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected to, or coupled to the other element or layer, or one or more intervening elements or layers may be present. When an element is referred to as being "directly on," "directly connected to," or "directly coupled to" another element or layer, there may be no intervening elements or layers present. Like numerals refer to like elements throughout. As used herein, the term "and/or" includes any and all combinations of one or more of the associated listed items.

It will be understood that although the terms first, second, third, fourth, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed as a second element, component, region, layer, or section without departing from the teachings of the invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations), and the spatially relative descriptors used herein are interpreted accordingly.

The terminology used herein is for the purpose of describing particular example embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein, but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a donor substrate in accordance with example embodiments.

Referring to FIG. 1, a donor substrate 100 in accordance with example embodiments may include a base substrate 110, a light-to-heat conversion layer 120, a buffer layer 130, a transfer layer 140, a rib structure 150, etc.

The base substrate 110 may include a material having a set or predetermined flexibility and a set or predetermined strength. For example, the base substrate 110 may include a transparent resin such as a polyethylene terephthalate-based resin, a polyester-based resin, a polyacryl-based resin, a polyepoxy-based resin, a polyethylene-based resin, a polystyrene-based resin, etc. When the base substrate 110 has a relatively small thickness, the donor substrate 100 may not be easily treated or processed. When the base substrate 110 has a relatively large thickness, a weight of the donor substrate 100 may increase, so that carrying the donor substrate 100 may be difficult. Therefore, the base substrate 110 may have a thickness between about 10 μm and about 500 μm. The base substrate 100 may support elements of the donor substrate 100.

The light-to-heat conversion layer 120 may be disposed on the base substrate 110. The light-to-heat conversion layer 120 may include a light absorbing material that may convert energy of a laser beam irradiated from a laser irradiation apparatus to a thermal energy. In example embodiments, the light-to-heat conversion layer 120 may include a metal-containing layer including aluminum (Al), molybdenum (Mo), an oxide thereof, and/or a sulfide thereof. In this case, the metal-containing layer may have a relatively small thickness between about 10 nm and about 500 nm. In some example embodiments, the light-to-heat conversion layer 120 may include an organic-containing layer including polymers having carbon black, graphite, and/or an infra-red dye. In this case, the organic-containing layer may have a relatively large thickness between about 100 mm and about 10 μm. An adhesive strength between the transfer layer 140 and the light-to-heat conversion layer 120 may be changed by the thermal energy that is supplied by the laser beam irradiated on the light-to-heat conversion layer 120, so that the transfer layer 140 may be transferred with a set or predetermined pattern onto a display substrate of an organic light emitting display device.

The buffer layer 130 may be disposed between the light-to-heat conversion layer 120 and the transfer layer 140. The buffer layer 130 may include an organic material. The buffer layer 130 may prevent an organic material of the transfer layer 140 from being damaged, and may control an adhesive strength between the transfer layer 140 and the light-to-heat conversion layer 120. In some example embodiments, the donor substrate 100 may not include the buffer layer 130 depending on materials of the transfer layer 140 and/or the light-to-heat conversion layer 120.

The transfer layer 140 may be disposed on the buffer layer 130. In manufacturing the organic light emitting display device using the donor substrate 100, the transfer layer 140 may correspond to an organic light emitting layer on the display substrate of the organic light emitting display device. That is, the organic light emitting layer may be formed from the transfer layer 140 of the donor substrate 100. In some example embodiments, the transfer layer 140 may further include a hole injection layer (HIL), a hole transfer layer (HTL), an electron transfer layer (ETL), and/or an electron injection layer (EIL). An organic light emitting structure including a plurality of the organic layers may be formed on the display substrate from the transfer layer 140 having a multi-layer structure.

Referring to FIG. 1, the rib structure 150 may be disposed on the transfer layer 140. The rib structure 150 may include a plurality of first tubes 160 and a plurality of second tubes 170. In this case, the first tubes 160 and the second tubes 170 may be spaced apart from one another at a set or predetermined distance on the transfer layer 140.

In example embodiments, the rib structure 150 may include a plurality of first tubes 160 and a plurality of second tubes 170 that may be in fluid communication with one another. In this case, the first tubes 160 and the second tubes 170 may be arranged in a substantially matrix shape or a substantially sieve shape.

The first tubes 160 may extend in a first direction to be substantially parallel to one another on the transfer layer 140. The first tubes 160 may be spaced apart from one another at a first distance substantially corresponding to a horizontal width of a pixel region of the organic light emitting display device. For example, the first tubes 160 may be spaced apart at a first distance that is substantially the same as the horizontal width of a pixel region of the organic light emitting display device, or at a first distance that is substantially the same as an integer multiple of the horizontal width of a pixel region of the organic light emitting display device.

The second tubes 170 may extend in a second direction that is substantially perpendicular to the first direction. The second tubes 170 also may be arranged substantially parallel to one another on the transfer layer 140. The second tubes 170 may be spaced apart from one another at a second distance substantially corresponding to a portrait width of a pixel region of the organic light emitting display device. For example, the second tubes 170 may be spaced apart at a second distance that is substantially the same as the portrait width of a pixel region of the organic light emitting display device, or at a second distance that is substantially the same as an integer multiple of the portrait width of the pixel region of the organic light emitting display device. Therefore, the first tubes 160 and the second tubes 170 of the rib structure 150 may intersect each other substantially perpendicularly on the transfer layer 140. Regions of the transfer layer 140 defined by the intersections of the first tubes 160 and the second tubes 170 may substantially correspond to pixel regions of the organic light emitting display device. For example, the regions of the transfer layer 140 defined by the intersections of the first tubes 160 and the second tubes 170 may have an area that is substantially the same as that of the pixel regions, or substantially the same as an integer multiple of an area of the pixel regions.

In some example embodiments, the first tubes 160 may be spaced apart from one another at a first distance that is substantially the same as the portrait width of the pixel region, or may be spaced apart at a first distance that is substantially the same as an integer multiple of the portrait width of the pixel region. In this case, the second tubes 170 may be spaced apart from one another at a second distance that is substantially the same as the horizontal width of the pixel region, or may be spaced apart at a second distance that is substantially the same as an integer multiple of the horizontal width of the pixel region.

As illustrated in FIG. 1, the first tubes 160 may include a plurality of first openings 180, and the second tubes 170 may include a plurality of second openings 181. The first openings 180 may be located on upper portions and side portions of the first tubes 160, and the second openings 181 may be located on upper portions and side portions of the second tubes 170. For example, the first openings 180 may be arranged along the first direction, and the second openings 181 may be arranged along the second direction. That is, each of the first openings 180 and the second openings 181 may be arranged along directions substantially perpendicular to each other. The first and second openings 180 and 181 may be spaced apart at a set or predetermined distance regularly, or may be spaced apart irregularly on the first and second tubes 160 and 170.

In example embodiments, each of the first and the second tubes 160 and 170 may have polygonal cross sections. For example, the first and the second tubes 160 and 170 may have various cross-sectional shapes such as a substantially rectangular shape, a substantially square shape, and/or a substantially trapezoidal shape. In some example embodiments, each of the first and the second tubes 160 and 170 may have rounded cross sections. For example, the first and the second tubes 160 and 170 may have various rounded cross-sectional shapes such as a substantially semicircular shape, a substantially semielliptical shape, and/or a substantially dome shape facing an upper direction.

In example embodiments, each of the first and the second tubes 160 and 170 may have a width that is substantially smaller than a space or a distance between adjacent pixel regions of the organic light emitting display device. For example, each of the first and the second tubes 160 and 170 may have a width that is substantially smaller than about 10 mm. When heights of the first and the second tubes 160 and 170 are relatively small, the first and the second tubes 160 and 170 may not serve as passages for gases, and the first and the second tubes 160 and 170 may not include the first and the second openings 180 and 181 due to relatively small surface areas of the first and the second tubes 160 and 170. When the heights of the first and the second tubes 160 and 170 are relatively large, the display substrate of the organic light emitting display device and the transfer layer 140 of the donor substrate 100 may not contact in a lamination process which will be described below. Therefore, the first and the second tubes 160 and 170 may have set or predetermined heights depending on a formation of the first and the second openings 180 and 181, and a contact of the display substrate and the transfer layer 140. For example, the first and the second tubes 160 and 170 may have heights between about 5 mm and about 10 mm. In this case, a ratio between the widths and the heights of the first and the second tubes 160 and 170 may be between about 1.0:0.5 and about 1.0:1.0. However, the widths and the heights of the first and the second tubes 160 and 170 may vary in accordance with a dimension of the pixel region and the space between adjacent pixel regions.

In example embodiments, each of the first and the second tubes 160 and 170 may include a material having a set or predetermined processability and a set or predetermined elasticity. For example, the first and the second tubes 160 and 170 may include silicon, urethane, aluminum, etc. When the first and the second tubes 160 and 170 do not have an adequate elasticity, a pressure applied in the lamination process that will be described below may damage the first and the second tubes 160 and 170.

In example embodiments, the donor substrate 100 may include the rib structure 150 having a plurality of first tubes 160 and a plurality of second tubes 170. The rib structure 150 may be disposed between the display substrate and the transfer layer 140 in the laser induced thermal imaging process for forming an organic layer pattern on the display substrate. The organic layer pattern may be disposed on the display substrate. Then, when the donor substrate 100 is removed from the display substrate, air or inert gases may be released between the display substrate and the donor substrate 100 through the first and the second openings 180 and 181 of the first and the second tubes 160 and 170. Accordingly, the donor substrate 100 may be easily removed from the display substrate without damaging the organic layer pattern on the display substrate.

Figure 2:
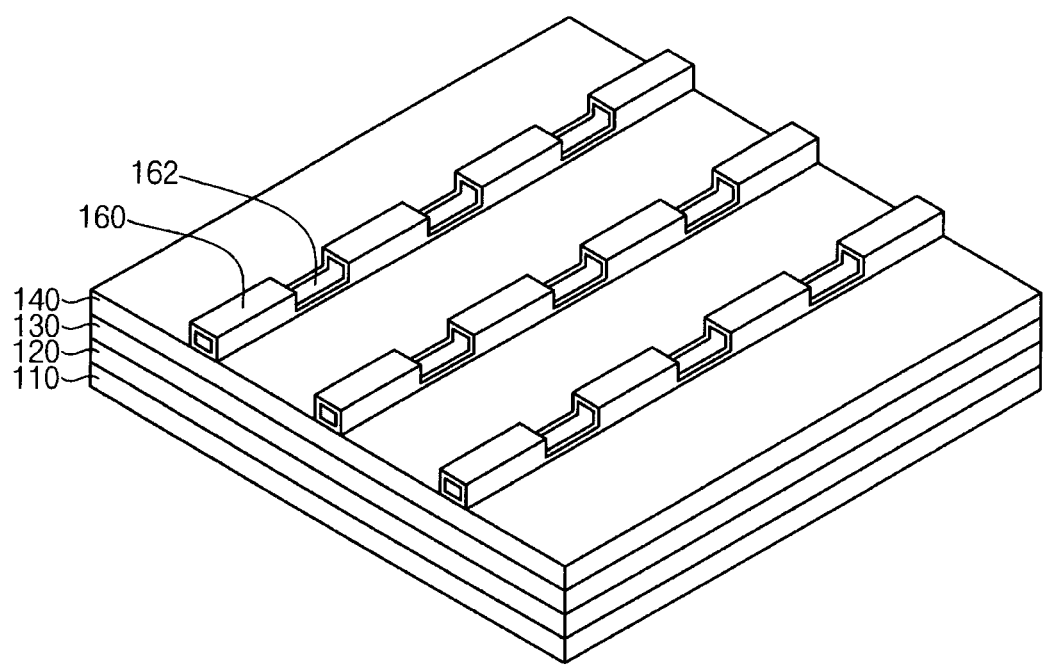
FIGS. 2 and 3 are perspective views illustrating a method of manufacturing a donor substrate in accordance with example embodiments.
Figure 3:
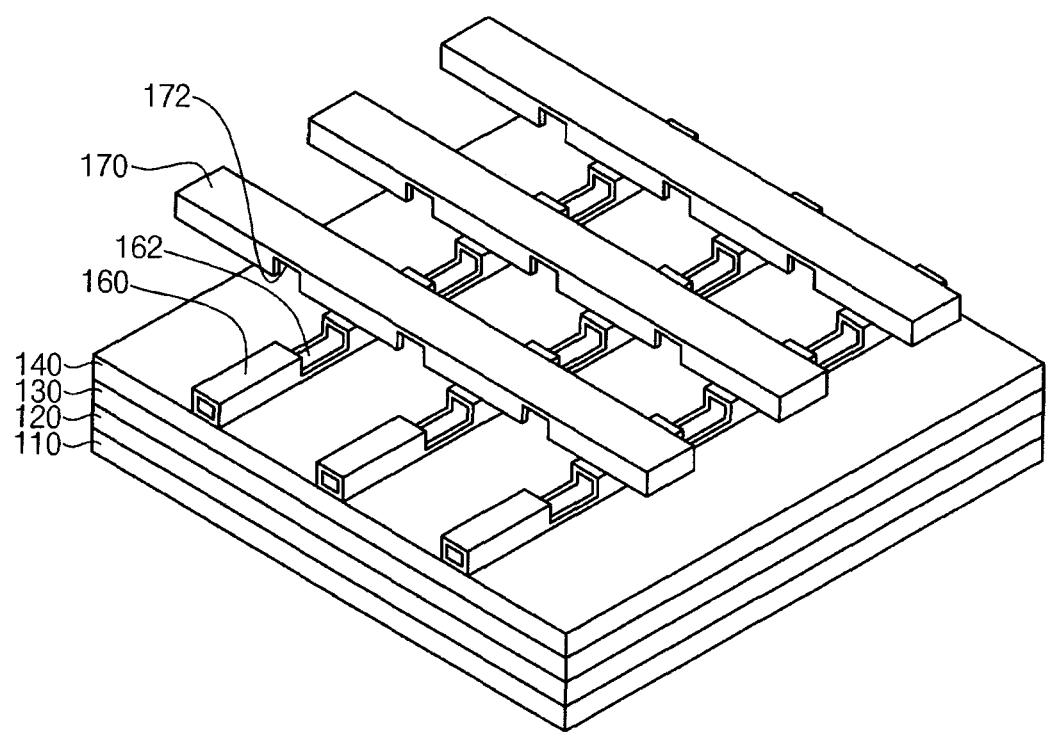

FIGS. 2 and 3 are perspective views illustrating a method of manufacturing a donor substrate in accordance with example embodiments. The method illustrated in FIGS. 2 and 3 may provide a donor substrate having a construction that is substantially the same as or substantially similar to that of the donor substrate described with reference to FIG. 1.

Referring to FIG. 2, a base substrate 110 including a transparent resin may be provided, and then a light-to-heat conversion layer 120 may be formed on the base substrate 110. In example embodiments, forming the light-to-heat conversion layer 120 may include forming a metal-containing layer on the base substrate 110. In this case, the light-to-heat conversion layer 120 may be formed using aluminum, molybdenum, an oxide thereof, and/or a sulfide thereof. In some example embodiments, forming the light-to-heat conversion layer 120 may include forming an organic-containing layer on the base substrate 110. In this case the organic-containing layer may be formed using a polymer including carbon black, graphite, and/or an infra-red dye.

When the metal-containing layer is included in the light-to-heat conversion layer 120, the metal containing layer may be formed by a sputtering process, an evaporation process, an e-beam evaporation process, etc. The light-to-heat conversion layer 120 including the metal-containing layer may be formed with a relatively small thickness. For example, the light-to-heat conversion layer 120 may be formed on the substrate 110 with a thickness between about 10 nm and about 500 nm. When the organic-containing layer is included in the light-to-heat conversion layer, the organic-containing layer may be formed by a spin coating process, a knife coating process, an extrusion process, etc. In this case, the light-to-heat conversion layer 120 including the organic-containing layer may be formed with a relatively large thickness. For example, the light-to-heat conversion layer 120 may be formed on the base substrate 110 with a thickness between about 100 nm and about 10 um.

A buffer layer 130 may be formed on the light-to-heat conversion layer 120. Forming the buffer layer 130 may include depositing an organic material on the light-to-heat conversion layer 120 by an extrusion process, a spin coating process, and/or a knife coating process. In some example embodiments, forming the buffer layer 130 between the light-to-heat conversion layer 120 and a transfer layer 140 may be omitted.

The transfer layer 140 may be formed on the buffer layer 130. The transfer layer 140 may be formed using a high molecular weight material or a low molecular weight material. The transfer layer 140 may be formed using various organic materials depending on pixel regions of the organic light emitting display device. The transfer layer 140 may be formed by an extrusion process, a spin coating process, a knife coating process, an evaporation process, a chemical vapor deposition process, etc. For example, the transfer layer 140 may be formed on the buffer layer 130 with a thickness between about 10 nm and about 5000 nm. In example embodiments, the transfer layer 140 may correspond to an organic light emitting layer of the organic light emitting display device. In some example embodiments, the transfer layer 140 may further include a hole injection layer, a hole transfer layer, an electron injection layer, an electron transfer layer, etc.

A rib structure 150 may be formed on the transfer layer 140. In example embodiments, forming the rib structure 150 may include forming first tubes 160 spaced apart at a set or predetermined distance and forming second tubes 170. The second tubes 170 may be in fluid communication with the first tubes 160.

Referring to FIGS. 2 and 3, the first tubes 160 and the second tubes 170 may be formed using a material having a set or predetermined processability and a set or predetermined elasticity, and then portions of the first tubes 160 and the second tubes 170 may be removed. That is, a plurality of first grooves 162 (shown in FIG. 2) and a plurality of second grooves 172 (shown in FIG. 3) may be formed on the first and the second tubes 160 and 170, respectively. The first and the second grooves 162 and 172 may be formed on the first and the second tubes 160 and 170, respectively, to be spaced apart from one another at a set or predetermined distance. In this case, the first and the second grooves 162 and 172 may have shapes substantially the same as or substantially similar to one another. When the second tubes 170 are located on the first tubes 160, the second grooves 172 on the second tubes 170 may have dimensions that are substantially smaller than those of the first grooves 162 on the first tubes 160. However, when the first tubes 160 are located on the second tubes 170, the first grooves 162 on the first tubes 160 may have dimensions that are substantially smaller than those of the second grooves 172 on the second tubes 170.

As illustrated in FIG. 2, the first tubes 160 including the first grooves 162 may be formed on the transfer layer 140 and extend in a first direction. In this case, the first tubes 160 may be spaced apart at a first distance that is substantially the same as a horizontal width of the pixel region of the organic light emitting display device, or an integer multiple of the horizontal width of the pixel region. In some example embodiments, the second tubes 170 including the second grooves 172 may be formed on the transfer layer 140 and are substantially parallel to one another.

As illustrated in FIG. 3, the second tubes 170 having the second grooves 172 may be disposed on the first tubes 160. In this case, the first grooves 162 on the first tubes 160 may be matched to the second grooves 172 on the second tubes 170, so that the first tubes 160 may be in fluid communication with the second tubes 170. The second tubes 170 may be connected to the first tubes 160. The second tubes 170 may extend in a second direction that is substantially perpendicular to the first direction. For example, the rib structure 150 including the first and the second tubes 160 and 170 may be formed on the transfer layer 140 to have a substantially matrix shape or a substantially sieve shape. The second tubes 170 may be spaced apart from one another at a second distance that is substantially the same as a portrait width of the pixel region of the organic light emitting display device, or an integer multiple of the portrait width of the pixel region. The first and the second tubes 160 and 170 may be fixed on the transfer layer 140 using an adhesive. The first and the second tubes 160 and 170 may be fixed to each other using the adhesive.

In some example embodiments, the second tubes 170 may be disposed on the transfer layer 140, and then the first tubes 160 may be combined with the second tubes 170. In some example embodiments, the first and the second tubes 160 and 170 may be combined with one another, and then the first and the second tubes 160 and 170 may be fixed on the transfer layer 140. In some example embodiments, the first and the second tubes 160 and 170 may be substantially formed integrally, and then the first and the second tubes 160 and 170 may be fixed on the transfer layer 140.

The first openings (not illustrated in FIG. 3) and the second openings (not illustrated in FIG. 3) may be formed on upper portions and side portions of the first and the second tubes 160 and 170. The first and the second openings may be formed using a member having a sharp end portion such as a needle, a drill, and/or a knife. The first and the second openings may be spaced apart at a set or predetermined distance regularly, or may be spaced apart irregularly on the upper portions and the side portions of the first and second tubes 160 and 170.

Figure 4:
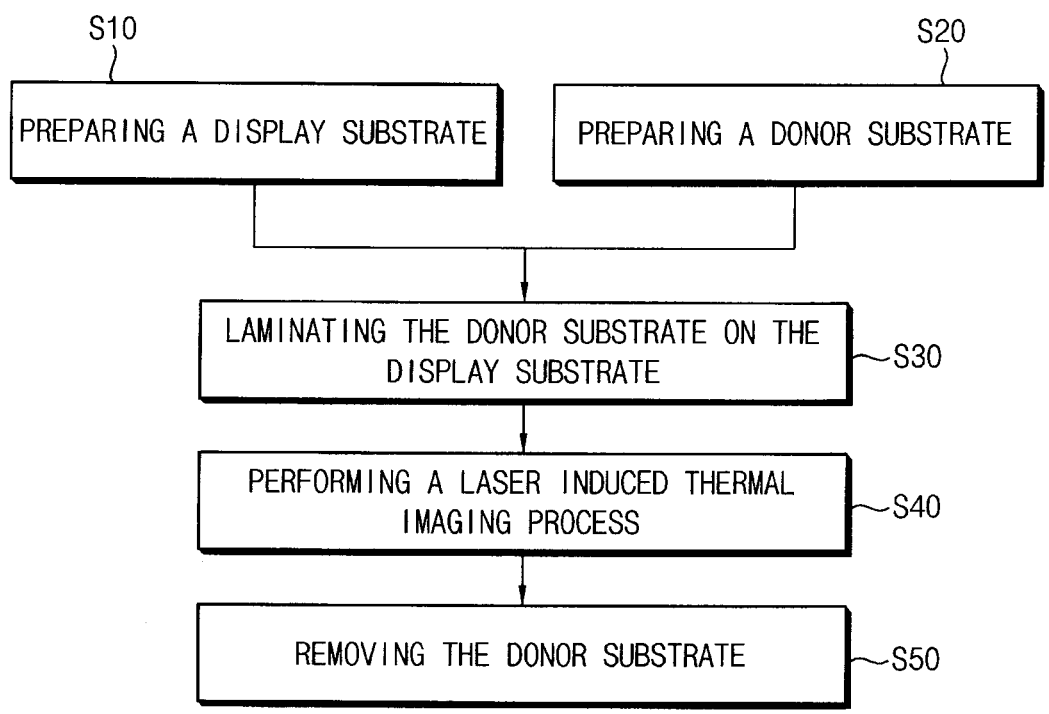
FIG. 4 is a block diagram illustrating a method of forming an organic layer pattern on a display substrate in accordance with example embodiments.

FIG. 4 is a block diagram illustrating a method of forming an organic layer pattern on a display substrate in accordance with example embodiments.

Referring to FIG. 4, a display substrate of an organic light emitting display device may be provided in step S10, and a donor substrate for forming organic layer patterns on the display device may be prepared in step S20. In this case, a switching device, an insulation layer, a pixel electrode, and/or a pixel defining layer may be formed on the display substrate. The donor substrate may have a constitution that is substantially the same as or substantially similar to that of the donor substrate 100 described with reference to FIG. 1.

A transfer layer of the donor substrate may be arranged to oppose or face pixel regions of the display substrate, and the donor substrate may be laminated onto the display substrate in step S30. The transfer layer of the donor substrate may be spaced apart from the display substrate at a set or predetermined distance by a rib structure of the donor substrate. In this case, the rib structure may have a constitution that is substantially the same as or substantially similar to the rib structure 150 described with reference to FIG. 1.

A laser induced thermal imaging process may be performed at the donor substrate to transfer the transfer layer of the donor substrate onto the pixel region of the display substrate in step S40. Therefore, the organic layer patterns may be formed on the pixel regions of the display substrate.

The donor substrate may be removed from the display substrate in step S50. Air or inert gases may be provided between the donor substrate and the display substrate through the rib structure of the donor substrate, so that the donor substrate may be easily removed without damaging the organic layer patterns on the display substrate.

Figure 5:
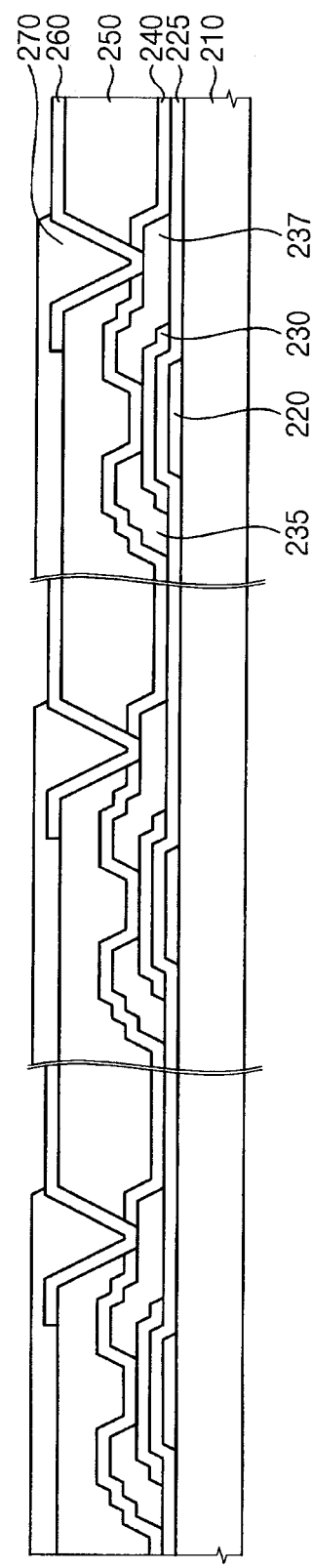
FIG. 5 is a cross-sectional view illustrating a method of manufacturing a display substrate of an organic light emitting display device in accordance with example embodiments.

FIG. 5 is a cross-sectional view illustrating a method of manufacturing a display substrate of an organic light emitting display device in accordance with example embodiments.

Referring to FIG. 5, a display substrate 200 in accordance with example embodiments may include a substrate 210, switching devices on the substrate 210, pixel electrodes 260 electrically connected to the switching devices, etc. The display substrate 200 may include gate lines (not illustrated) and data lines (not illustrated) that may define a plurality of pixel regions.

In a formation of one of the switching devices of the organic light emitting display device, a gate electrode 220 may be formed on the substrate 210, and a gate insulation layer 225 may be formed on the substrate 210 to cover the gate electrode 220. An active pattern 230 may be formed on the gate insulation layer 225, and a source electrode 235 and a drain electrode 237 which may be spaced apart from each other may be formed on the active pattern 230. A protection layer 240 may be formed on the gate insulation layer 225 to cover the source electrode 235, the drain electrode 237, and the active pattern 230.

The gate electrode 220 of the switching device may contact one of the gate lines. The gate electrode 220 may be formed using a metal, an alloy, a metal nitride, a conductive metal oxide, etc. For example, the gate electrode 220 may be formed using aluminum (Al), tungsten (W), copper (Cu), nickel (Ni), chromium (Cr), molybdenum (Mo), titanium (Ti), platinum (Pt), silver (Ag), tantalum (Ta), ruthenium (Ru), alloys thereof, a nitride thereof, indium tin oxide (ITO), indium zinc oxide (IZO), zinc tin oxide (ZTO), zinc oxide (ZnOx), tin oxide (SnOx), gallium oxide (GaOx), etc. These may be used alone or in a combination thereof. The gate insulation layer 225 may be formed on the substrate 210 to cover the gate line and the gate electrode 220. The gate insulation layer 225 may be conformally formed along a profile of the gate electrode 220. The gate insulation layer 225 may be formed using a silicon compound, a metal oxide, etc. For example, the gate insulation layer 225 may be formed using silicon oxide (SiOx), silicon nitride (SiNx), silicon oxy-nitride (SiOxNy), hafnium oxide (HfOx), zirconium oxide (ZrOx), aluminum oxide (AlOx), tantalum oxide (TaOx), etc. These may be used alone or in a combination thereof. The gate insulation layer 225 may have a single layer structure or a multi-layer structure including the silicon compound and/or the metal oxide.

The active pattern 230 may be formed using silicon. For example, the active pattern 230 may be formed using polysilicon, polysilicon doped with impurities, amorphous silicon, amorphous silicon doped with impurities, partially crystalline silicon, silicon containing micro crystalline, etc. The source electrode 235 may contact the data line. The source and the drain electrodes 235 and 237 may be formed adjacent to the gate electrode 220, and may be spaced apart at a set or predetermined distance. The source and the drain electrodes 235 and 237 may be formed using a metal, an alloy, a metal nitride, a conductive metal oxide, etc. For example, the source and the drain electrodes 235 and 237 may be formed using aluminum, tungsten, copper, nickel, chromium, molybdenum, titanium, platinum, silver, tantalum, ruthenium, alloys thereof, a nitride thereof, indium tin oxide, indium zinc oxide, zinc tin oxide, zinc oxide, tin oxide, gallium oxide, etc. These may be used alone or in a combination thereof.

The protection layer 240 may be formed on the gate insulation layer 225 to cover the source electrode 235, the drain electrode 237, and the active pattern 230. The protection layer 240 may be conformally formed along profiles of the source electrode 235, the drain electrode 237, and the active pattern 230. The protection layer 240 may be formed using the silicon compound. For example, the protection layer 240 may be formed using a silicon oxide, a silicon nitride, a silicon oxynitride, a silicon carbon nitride, a silicon wry-carbide, etc.

As illustrated in FIG. 5, an insulation layer 250 may be formed on the protection layer 240. The insulation layer 250 may be formed using a transparent organic material. For example, the insulation layer 250 may be formed using an acryl-based resin-based resin, an epoxy-based resin-based resin, a phenol-based resin-based resin, a polyamide-based resin-based resin, a polyimide-based resin-based resin, an unsaturated polyester-based resin-based resin, a polyphenylene-based resin-based resin, a polyphenylene sulfide-based resin-based resin, benzocyclobutene (BCB), etc. These may be used alone or in a combination thereof. The insulation layer 250 may have a substantially level upper side for forming elements of the organic light emitting display device thereon. An opening (e.g., hole) may be formed through the insulation layer 250 and the protection layer 240 to partially expose the drain electrode 237 of the switching device.

A pixel electrode 260 may be formed on the insulation layer 250 at the pixel region of the display substrate 200. The pixel electrode 260 may be formed on a lower part and a sidewall of an opening formed through the insulation layer 250 and the protection layer 240, so that the pixel electrode 260 may be electrically connected to the drain electrode 237. The pixel electrode 260 may be formed using a material having a set or predetermined reflectivity or a substantially transparent material. For example, when the organic light emitting display device is a bottom emission type, the pixel electrode 260 may be formed using a transparent conductive material such as indium tin oxide (ITO), indium zinc oxide (IZO), zinc tin oxide (ZTO), zinc oxide (ZnOx), tin oxide (SnOx), galliumoxide (GaOx), etc. These may be used alone or in a combination thereof. The pixel electrode 260 may have a single layer structure or a multi-layer structure including the transparent conductive material. Alternatively, when the organic light emitting display device is a top emission type, the pixel electrode 260 may be formed using aluminum, tungsten, copper, nickel, chromium, molybdenum, titanium, platinum, silver, tantalum, ruthenium, an alloy thereof, a nitride thereof, etc. In this case, the pixel electrode 260 may have a single layer structure or a multi-layer structure including the metals, the alloy, and/or the nitride.

A pixel defining layer 270 may be formed on the insulation layer 250 and the pixel electrode 260 at the pixel region of the display substrate 200. The pixel defining layer 270 may be formed using an organic material or an inorganic material.

For example, the pixel defining layer 270 may be formed using the organic material such as photoresist, a polyacryl-based resin-based resin, a polyimide-based resin-based resin, and/or an acryl-based resin-based resin, or the inorganic material such as a silicon compound. The pixel defining layer 270 may define a region that emits light in the pixel region as a light emitting region.

In the display substrate 200 described with reference to FIG. 5, the switching device may include a thin film transistor having a bottom gate structure where the gate electrode 220 may be disposed on the substrate 210. However, a constitution of the switching device may not be limited thereto. For example, the switching device may have a top gate structure where a gate electrode may be disposed under a semiconductor layer. Alternatively, the switching device may include an oxide semiconductor device that includes an active layer containing a semiconductor oxide.

Figure 6:
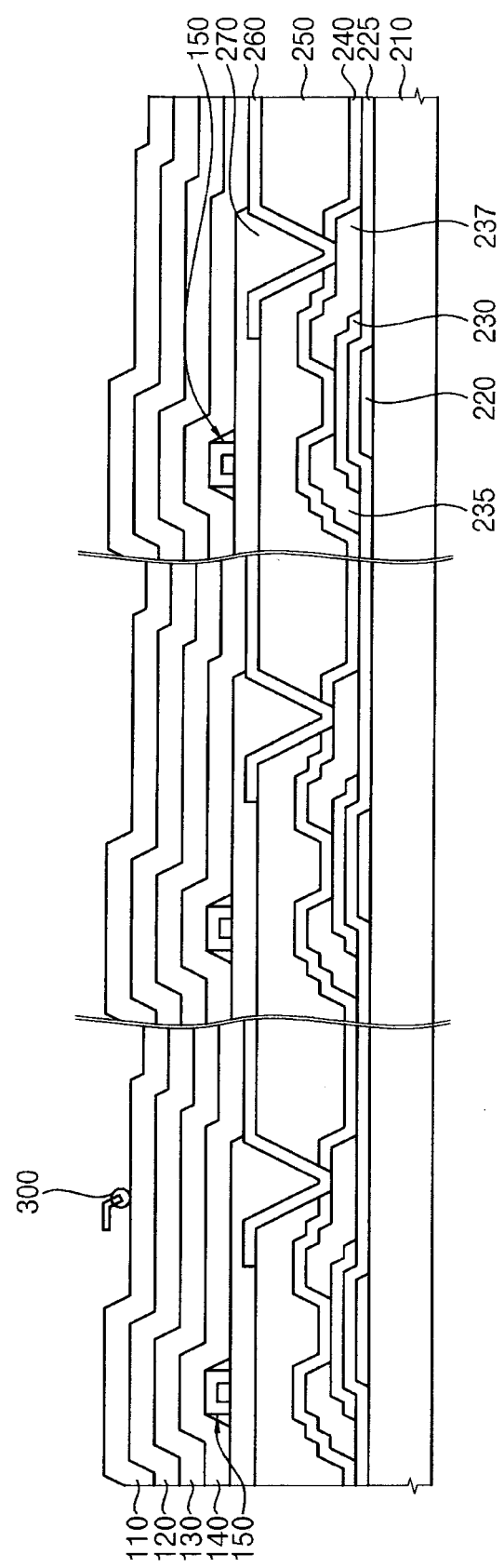
FIGS. 6 to 8 are cross-sectional views illustrating a method of forming an organic layer pattern on a display substrate in accordance with some example embodiments.
Figure 7:
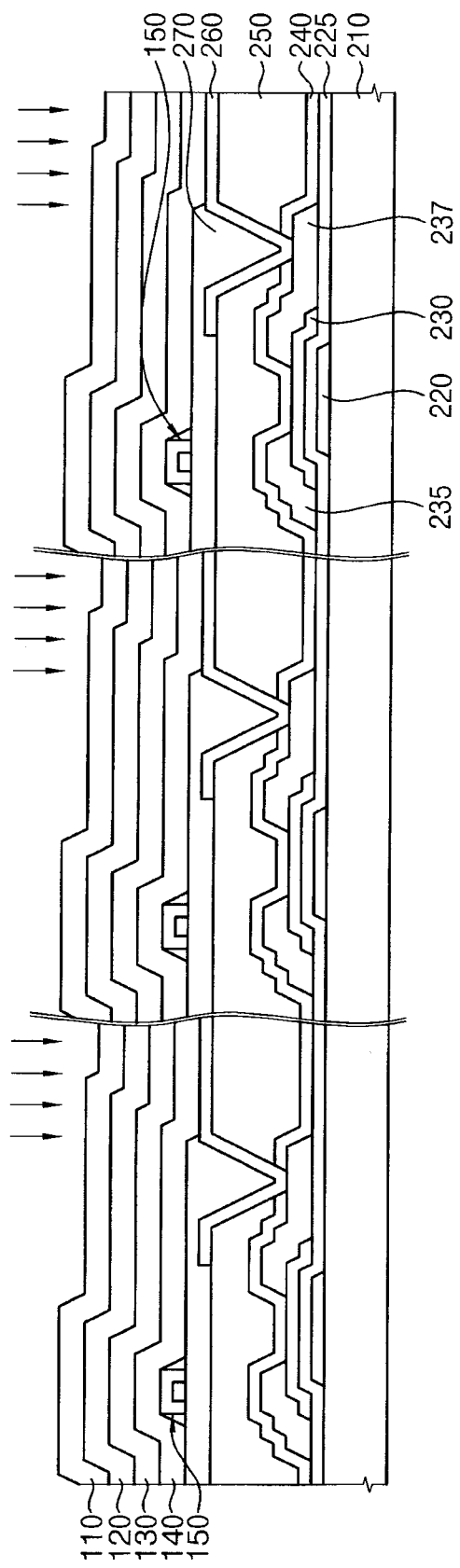
Figure 8:
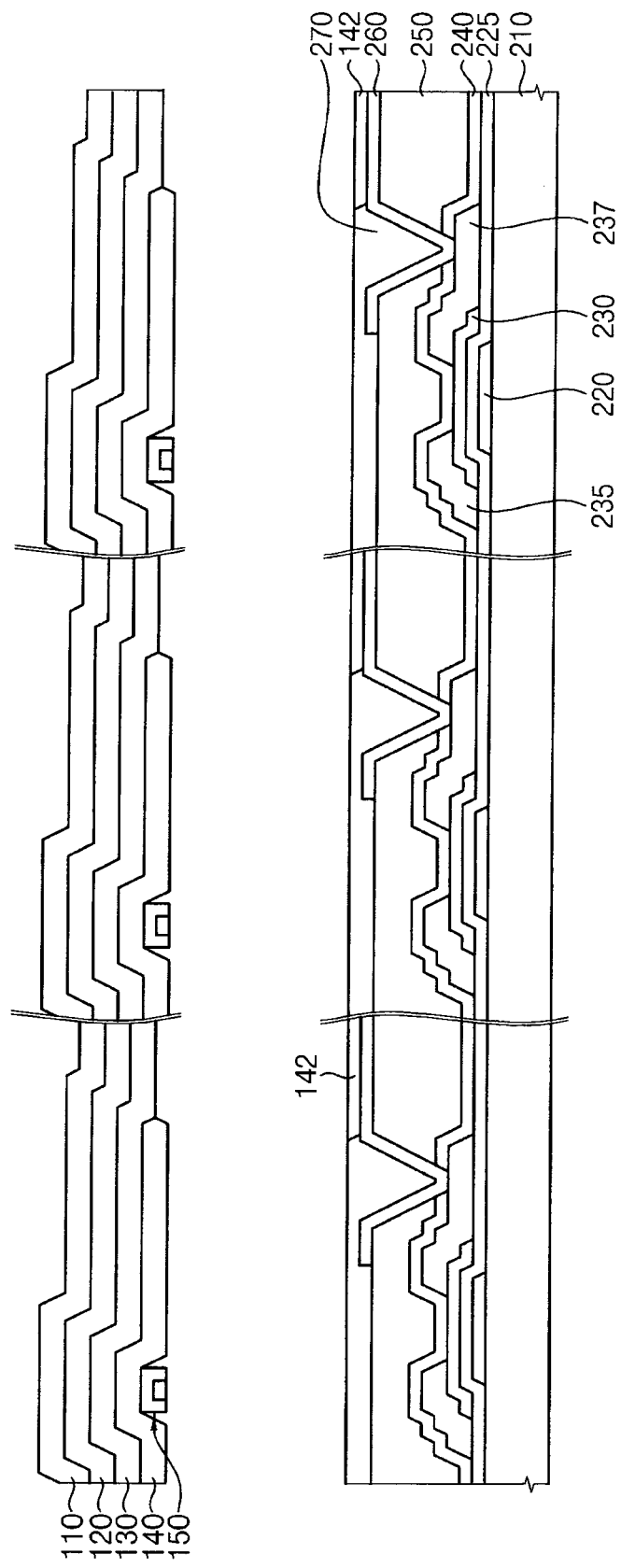

FIGS. 6 to 8 are cross-sectional views illustrating a method of forming an organic layer pattern on a display substrate in accordance with some example embodiments. In the method described with reference to FIGS. 6 to 8, processes for forming the display substrate of an organic light emitting display device may be substantially the same as or substantially similar to the processes for forming the display substrate 200 described with reference to FIG. 5. In the method illustrated in FIGS. 6 to 8, a donor substrate may have a constitution that is substantially the same as or substantially similar to that of the donor substrate 100 described with reference to FIG. 1.

FIG. 6 is a cross-sectional view illustrating a step for laminating the donor substrate onto the display substrate.

Referring to FIG. 6, the donor substrate including a rib structure 150 may be laminated onto the display substrate including a pixel electrode 260 and a pixel defining layer 270, so that the donor substrate may be adhered to the display substrate. The display substrate may include a switching device, a protection layer 240, an insulation layer 250, and/or the pixel defining layer 270 disposed on a substrate 210. The donor substrate may include a light-to-heat conversion layer 120, a buffer layer 130, a transfer layer 140, and/or the rib structure 150 disposed on a base substrate 110.

In example embodiments, the display substrate may be mounted on a supporting apparatus (not illustrated), and the donor substrate may be aligned with the display substrate. In this case, the first and the second tubes of the rib structure 150 may be aligned not to overlap pixel regions of the display substrate. For example, the pixel regions of the display substrate may substantially correspond to regions of the transfer layer 140 defined by intersections of the first and the second tubes.

After arranging the donor substrate on the display substrate, a pressurizing member 300 may apply pressure to the donor substrate to laminate the donor substrate including the transfer layer 140, the buffer layer 130, the light-to-heat conversion layer 120, and the base substrate 110, onto the pixel electrode 260 and the pixel defining layer 270 of the display substrate. In this case, the rib structure 150 of the donor substrate may be adhered to the pixel defining layer 270 of the display substrate, and the transfer layer 140 of the donor substrate may be adhered to the pixel electrode 260 and the pixel defining layer 270 of the display substrate.

The pressurizing member 300 may include a roller, a crown press, etc. In some example embodiments, pressure may be applied to the donor substrate by using gases without using the pressurizing member 300, so that the donor substrate including the transfer layer 140 may be adhered to the display substrate including the pixel electrode 260 and the pixel defining layer 270. According to the above-described lamination process, the donor substrate may be adhered to the display substrate, and a bubble between the donor substrate and the display substrate may be removed.

FIG. 7 is a cross-sectional view illustrating a step for irradiating a laser beam on the donor substrate.

Referring to FIG. 7, the laser beam as indicated using arrows may be irradiated on portions of the donor substrate that may be adhered to the display substrate. In example embodiments, the laser beam may be irradiated at a region where the pixel electrode 260 of the display substrate may be disposed. At the region where the laser beam is irradiated, an adhesive strength between the transfer layer 140 and the pixel electrode 260 may be larger than that between the buffer layer 130 and the transfer layer 140. Therefore, a portion of the transfer layer 140 where the laser beam is irradiated may be removed from the buffer layer 130, and an organic layer pattern 142 (see FIG. 8) may be formed on the pixel electrode 260 from the transfer layer 140. In example embodiments, the organic layer pattern 142 may be formed on the display substrate using a laser induced thermal imaging process, so that the organic layer pattern 142 having a relatively high resolution may be obtained at relatively low cost due to a relatively high resolution of the laser beam.

In example embodiments, the organic layer pattern 142 may be formed from the transfer layer 140 at a pressure below about $10^{-2}$ Torr. The organic layer pattern 142 may be formed in a vacuum chamber, so that contamination of the pixel electrode 260 of the display substrate and the organic layer pattern 142 may be prevented during the formation of the organic layer pattern 142. As a result, a life span of the organic light emitting display device including the organic layer pattern 142 may be improved.

In some example embodiments, the transfer layer 140 may be formed in an atmosphere containing an inert gas. For example, the atmosphere containing the inert gas may include the inert gas and water vapor, or the inert gas and oxygen gas ($O_2$). For example, the inert gas may include nitrogen ($N_2$) gas and/or argon (Ar) gas, and a concentration of water vapor in the atmosphere containing the inert gas may be below about 10 ppm. Alternatively, a concentration of oxygen gas ($O_2$) in the atmosphere containing the inert gas may be below about 50 ppm. Oxygen gas and water vapor from outside may be easily mixed with the atmosphere containing the inert gas, so that a contamination of the organic layer pattern 142 may be prevented by controlling concentrations of water vapor and oxygen gas.

FIG. 8 is a cross-sectional view illustrating a step for removing the donor substrate from the display substrate.

As described above, the organic layer pattern 142 may be formed on the display substrate from the transfer layer 140 of the donor substrate, and then the donor substrate may be removed from the display substrate.

In example embodiments, first end portions of the first and the second tubes may be enclosed, and nozzles may be connected to second end portions of the first and the second tubes. The gases from the nozzles may be released between the display substrate and the donor substrate. For example, the gases may include an inert gas such as a nitrogen gas, an argon gas, etc. Gases supplied from the nozzles to the rib structure 150 may be provided between the display substrate and the donor substrate through the first openings and the second openings of the first and the second tubes. Therefore, the donor substrate may be removed from the display substrate, a separation between the donor substrate and the display substrate may start from a region adjacent to the first and the second tubes.

In example embodiments, the gases having a relatively low blowing pressure may be provided in a relatively large area from the central portion of the display substrate, so that the donor substrate may be easily removed without damage. As a result, a pixel failure of the organic light emitting display device including the display substrate may be prevented or reduced.

Figure 9:
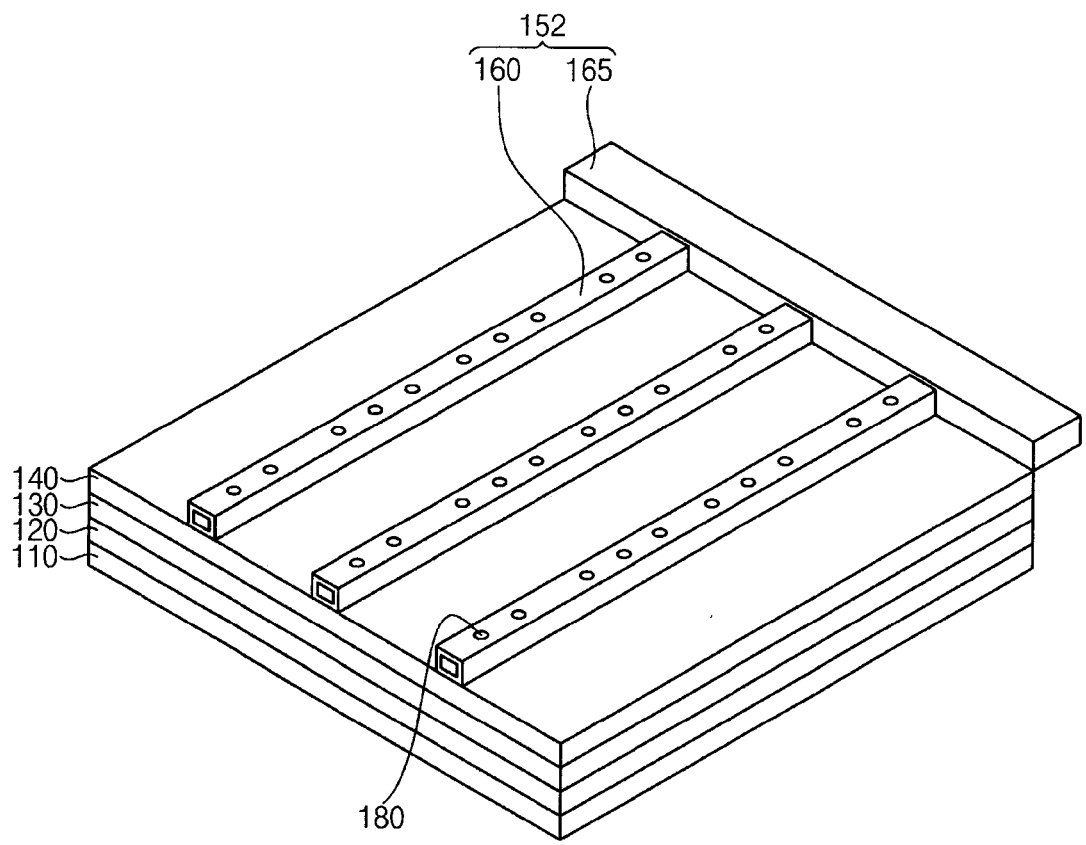
FIG. 9 is a perspective view illustrating a donor substrate in accordance with some example embodiments.

FIG. 9 is a perspective view illustrating a donor substrate 102 in accordance with some example embodiments.

Referring to FIG. 9, the donor substrate 102 may include a base substrate 110, a light-to-heat conversion layer 120, a buffer layer 130, a transfer layer 140, a rib structure 152, etc. The base substrate 110, the light-to-heat conversion layer 120, the buffer layer 130, and the transfer layer 140 may have constitutions that are substantially the same as or substantially similar to those of the base substrate 110, the light-to-heat conversion layer 120, the buffer layer 130, and the transfer layer 140 described with reference to FIG. 2.

The rib structure 152 may be disposed on the transfer layer 140. The rib structure 152 may include first tubes 160 and at least one of connection tubes 165. The first tubes 160 may be spaced apart at a set or predetermined distance substantially parallel to one another. First end portions of the first tubes 160 may be connected to the connection tube 165. In some example embodiments, both first and second end portions of the first tubes 160 may be connected to each of the connection tubes 165. For example, two connection tubes 165 may be disposed on the transfer layer 140.

In example embodiments, the first tubes 160 may extend in a first direction or a second direction on the transfer layer 140. The first tubes 160 may be spaced apart at a distance corresponding to a horizontal width or a portrait width of a pixel region of an organic light emitting display device. For example, the first tubes 160 may be spaced apart at the distance substantially the same as the horizontal or the portrait width of the pixel region of the organic light emitting display device, or an integer multiple of the horizontal or the portrait width of the pixel region. Both or one of first and second end portions of the first tubes 160 may be connected to the connection tube 165, and the first tubes 160 may be in fluid communication with one another through the connection tube 165. The connection tube 165 may extend in a direction substantially perpendicular to the first tubes 160. For example, a first connection tube may be connected to first end portions of the first tubes 160, and a second connection tube may be connected to second end portions of the first tubes 160.

The first tubes 160 and the connection tube 165 may have polygonal cross sections. For example, the first tubes 160 and the connection tube 165 may have various cross-sectional shapes such as a substantially rectangular shape, a substantially square shape, and/or a substantially trapezoidal shape. In some example embodiments, the first second tubes 160 and the connection tube 165 may have rounded cross sections. For example, the first tubes 160 and the connection tube 165 may have various rounded cross-sectional shapes such as a substantially semicircle shape, a substantially semiellipse shape, and/or a substantially dome shape facing an upper direction. Further, the connection tube 165 may have a size substantially larger than those of the first tubes 160. For example, a width and/or a height of the connection tube 165 may be substantially larger than widths and/or heights of the first tubes 160. The connection tube 165 may include a material substantially the same as or substantially similar to that of the first tubes 160. For example, the connection tube 165 may include silicon, urethane, aluminum, etc. In this case, the connection tube 165 may be formed integrally with the first tubes 160. In some example embodiments, the first tubes 160 may be combined with the connection tube 165 to be substantially perpendicular to one another.

As illustrated in FIG. 9, the first tubes 160 may include a plurality of first openings 180. For example, the first openings 180 may be formed on upper portions of the first tubes 160. The first openings 180 may be spaced apart at a set or predetermined distance regularly, or may be spaced apart irregularly. In some example embodiments, the first openings 180 may be formed on side portions of the first tubes 160 substantially similar to the first tubes 160 illustrated in FIG. 1.

In the donor substrate 102 illustrated in FIG. 9, the rib structure 152 may include first tubes 160 that are substantially parallel to one another. However, a constitution of the rib structure 152 may not be limited thereto. For example, the rib structure 152 may include a plurality of second tubes that are substantially perpendicular to the first tubes 160. In this case, the connection tube 165 may be connected to first end portions of the first tubes 160 or the second tubes. Alternatively, a first connection tube and a second connection tube may be connected to first end portions of the first tubes 160 and the second tubes, respectively. In some example embodiments, four connection tubes may be connected to both first and second end portions of the first tubes 160 and the second tubes. For example, the first to the fourth connection tubes may be connected to both first and second end portions of the first tubes 160 and both first and second end portions of the second tubes.

In example embodiments, the donor substrate 102 may include the rib structure 152 having a plurality of first tubes 160. During the formation of the organic layer pattern on the display substrate using a laser induced thermal imaging process, the rib structure 152 may be disposed between the display substrate and the transfer layer 140. Therefore, when the donor substrate 102 is removed from the display substrate, gases may be released between the display substrate and the donor substrate 102 through the first tubes 160, so that the donor substrate 102 may be easily removed from the display substrate without damaging the organic layer pattern disposed on the display substrate.

Figure 10:
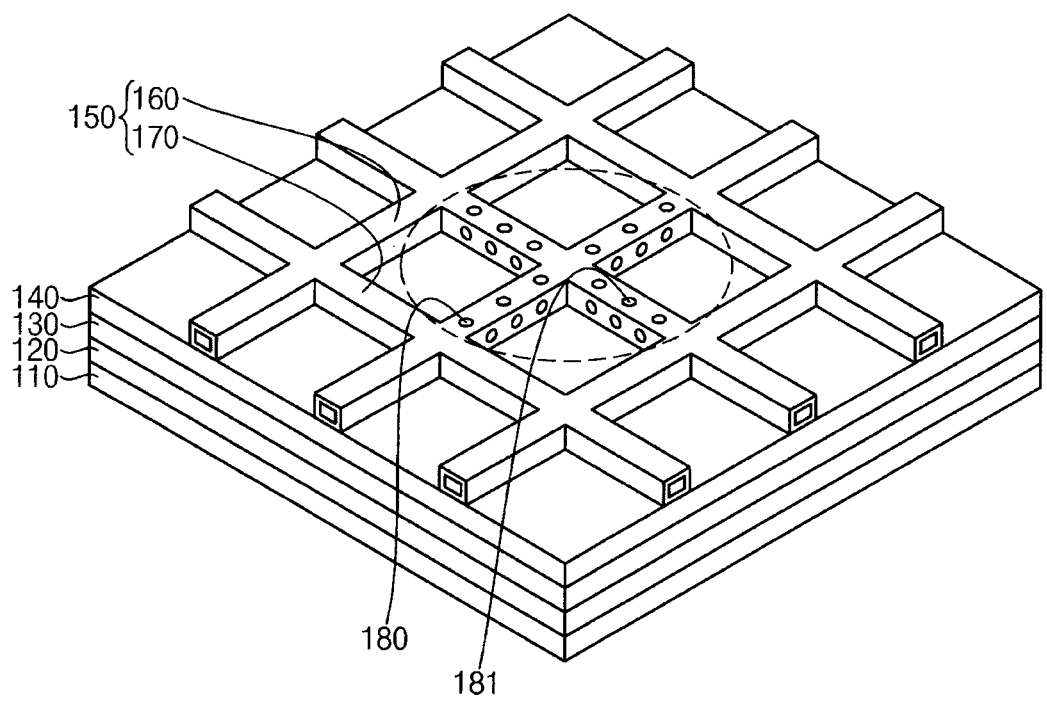
FIG. 10 is a perspective view illustrating a donor substrate in accordance with some example embodiments.

FIG. 10 is a perspective view illustrating a donor substrate 104 in accordance with some example embodiments.

Referring to FIG. 10, the donor substrate 104 may include a base substrate 110, a light-to-heat conversion layer 120, a buffer layer 130, a transfer layer 140, a rib structure 154, etc. The base substrate 110, the light-to-heat conversion layer 120, the buffer layer 130, and the transfer layer 140 may have constitutions that are substantially the same as or substantially similar to those of the base substrate 110, the light-to-heat conversion layer 120, the buffer layer 130, and the transfer layer 140 described with reference to FIG. 2.

The rib structure 154 may include a plurality of first tubes 160 and a plurality of second tubes 170. In the rib structure 154 illustrated in FIG. 10, dimensions, shapes, and/or arrangements of the first and the second tubes 160 and 170 may be substantially the same as or substantially similar to those of the first and the second tubes 160 and 170 described with reference to FIG. 1, so that a detailed description thereof may be omitted.

As illustrated in FIG. 10, the first openings 180 may be disposed on upper portions and side portions of at least one of the first tubes 160, and the second openings 181 may be disposed on upper portions and side portions of at least one of the second tubes 170. For example, the first openings 180 may be disposed on central portions of the first tubes 160 in a central region of the donor substrate 104, and the second openings 181 may be disposed on central portions of the second tubes 170 in the central region of the donor substrate 104. The first tubes 160 including the first openings 180 may be substantially perpendicular to the second tubes 170 including the second openings 181. That is, the first and the second openings 180 and 181 may be disposed at a central portion of the rib structure 154. In some example embodiments, at least one connection tube may be connected to end portions of the first tubes 160 and/or the second tubes 170.

Figure 11:
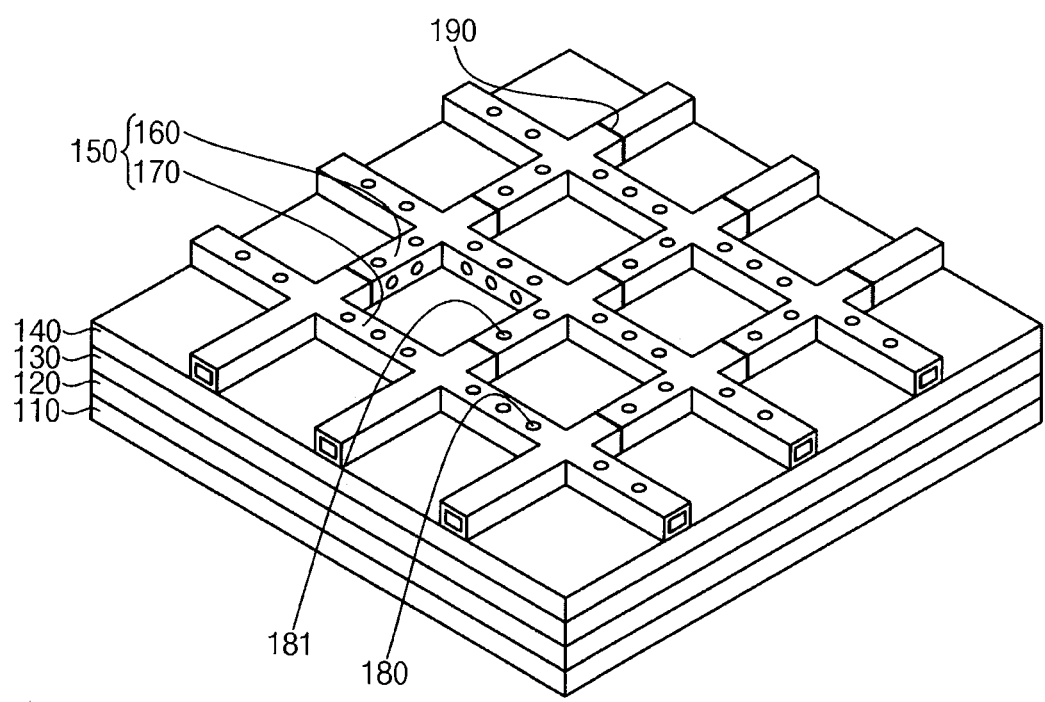
FIG. 11 is a perspective view illustrating a donor substrate in accordance with some example embodiments.

FIG. 11 is a perspective view illustrating a donor substrate 106 in accordance with some example embodiments.

Referring to FIG. 11, the donor substrate 106 may include a base substrate 110, a light-to-heat conversion layer 120, a buffer layer 130, a transfer layer 140, a rib structure 156, etc. The base substrate 110, the light-to-heat conversion layer 120, the buffer layer 130, and the transfer layer 140 may have constitutions that are substantially the same as or substantially similar to those of the base substrate 110, the light-to-heat conversion layer 120, the buffer layer 130, and the transfer layer 140 described with reference to FIG. 2.

As illustrated in FIG. 11, the rib structure 156 may include a plurality of first tubes 160 and a plurality of second tubes 170. In this case, dimensions, shapes, and/or arrangements of the first and the second tubes 160 and 170 may be substantially the same as or substantially similar to those of the first and the second tubes 160 and 170 described with reference to FIG. 1, so that a detailed description thereof may be omitted.

The rib structure 156 may further include partition walls 190 disposed in the first tubes 160 and/or second tubes 170. Although the partition walls 190 may be disposed in the second tubes 170 in FIG. 10, the partition walls 190 may be disposed in the first tubes 160 or in both the first tubes 160 and the second tubes 170. In this case, the partition walls 190 may be arranged along a first direction or a second direction not to disturb a flow of gases through the first tubes 160 and the second tubes 170. Therefore, when the donor substrate 106 is removed from the display substrate having a relatively large area, the pressure of the gases may be maintained at a set or predetermined pressure due to the partition walls 190. As a result, an organic layer pattern may be formed on the display substrate of the organic light emitting display device having a relatively large area without damage.

According to example embodiments, when a donor substrate is removed from a display substrate, a donor substrate including a rib structure containing a plurality of tubes may be employed. Therefore, the donor substrate may be easily removed without causing damage to an organic layer pattern regularly formed on the display substrate. As a result, a pixel failure of the organic light emitting display device including the display substrate may be prevented or reduced. The organic light emitting display device may be employed in various electronic and electric apparatuses such as televisions, mobile communication apparatuses, monitors, MP3 players, or portable display apparatuses.

The foregoing is illustrative of example embodiments, and is not to be construed as limiting thereof. Although a few example embodiments have been described, those skilled in the art will readily appreciate that many modifications are possible in the example embodiments without materially departing from the novel teachings and aspects of the example embodiments. Accordingly, all such modifications are intended to be included within the scope of the example embodiments as defined in the claims and their equivalents.

What is claimed is:

1. A donor substrate comprising:
    a base substrate;
    a light-to-heat conversion layer on the base substrate;
    a transfer layer on the light-to-heat conversion layer; and
    a rib structure on the transfer layer, the rib structure comprising a plurality of tubes spaced apart from one another.

2. The donor substrate of claim 1, wherein the tubes have a plurality of openings at at least one of upper portions or side portions of the tubes.

3. The donor substrate of claim 2, wherein the rib structure further comprises at least one connection tube connected to end portions of the tubes.

4. The donor substrate of claim 3, wherein the at least one connection tube comprises a material that is the same as that of the tubes.

5. The donor substrate of claim 3, wherein the at least one connection tube is integrally formed with the tubes.

6. The donor substrate of claim 3, wherein the at least one connection tube comprises a first connection tube and a second connection tube, the first connection tube being connected to first end portions of the tubes, and the second connection tube being connected to second end portions of the tubes.

7. The donor substrate of claim 1, wherein the rib structure comprises a plurality of first tubes and a plurality of second tubes, the first tubes extending in a first direction, the second tubes extending in a second direction.

8. The donor substrate of claim 7, wherein the first tubes and the second tubes are arranged in a matrix shape.

9. The donor substrate of claim 7, wherein the first tubes have a plurality of first openings at at least one of upper portions or side portions of the first tubes, and the second tubes have a plurality of second openings at at least one of upper portions or side portions of the second tubes.

10. The donor substrate of claim 7, wherein at least one of the first tubes at a central portion of the transfer layer has a plurality of first openings at at least one of upper portions or side portions of the first tubes, and at least one of the second tubes at the central portion of the transfer layer has a plurality of second openings at at least one of upper portions or side portions of the second tubes.

11. The donor substrate of claim 7, wherein the rib structure further comprises partition walls in at least one of the first tubes or the second tubes.

12. The donor substrate of claim 1, wherein the tubes comprise silicon, urethane, or aluminum.

13. The donor substrate of claim 1, wherein a ratio between a height and a width of the tubes is between about 1.0:0.5 and about 1.0:1.0.

14. A method of manufacturing a donor substrate, the method comprising:
    forming a light-to-heat conversion layer on a base substrate;
    forming a transfer layer on the light-to-heat conversion layer; and
    forming a rib structure on the transfer layer, the rib structure comprising a plurality of tubes spaced apart from one another.

15. The method of claim 14, wherein forming the rib structure further comprises forming a plurality of openings at at least one of upper portions or side portions of the tubes.

16. The method of claim 14, wherein forming the rib structure further comprises forming at least one connection tube connected to end portions of the tubes.

17. The method of claim 14, wherein forming the rib structure further comprises:
    forming first grooves on a plurality of first tubes of the tubes;
    forming second grooves on a plurality of second tubes of the tubes; and combining the first tubes with the second tubes by aligning the first grooves with the second grooves.

18. The method of claim 14, wherein forming the rib structure further comprises:
arranging a plurality of first tubes of the tubes on the transfer layer along a first direction; and
arranging a plurality of second tubes of the tubes on the transfer layer along a second direction, the second tubes intersecting the first tubes.

19. The method of claim 14, wherein forming the rib structure further comprises forming partition walls in at least one of first tubes or second tubes of the plurality of tubes.

20. A method of manufacturing an organic light emitting display device, the method comprising:
forming a rib structure on a base substrate to manufacture a donor substrate, the rib structure comprising a plurality of tubes, the base substrate comprising a light-to-heat conversion layer and a transfer layer;
laminating the donor substrate onto a display substrate;
irradiating a laser beam on the donor substrate, thereby to form an organic layer pattern on the display substrate from the transfer layer; and
discharging gases between the display substrate and the donor substrate through the rib structure to remove the donor substrate from the display substrate.

21. The method of claim 20, wherein forming a rib structure comprises:
arranging a plurality of tubes on the transfer layer, the tubes being spaced apart from one another; and
forming a plurality of openings at at least one of upper portions or side portions of the tubes.

22. The method of claim 21, wherein the tubes are spaced apart from one another at a distance about the same as an integer multiple of a width of a pixel region of the display substrate.

23. The method of claim 21, wherein forming the rib structure further comprises forming at least one connection tube connected to end portions of the tubes.

24. The method of claim 20, wherein forming the rib structure further comprises:
arranging a plurality of first tubes on the transfer layer, the first tubes being spaced apart from one another at a first distance; and
arranging a plurality of second tubes on the transfer layer, the second tubes being spaced apart from one another at a second distance.

25. The method of claim 24, wherein the first distance is about the same as an integer multiple of at least one of a horizontal width or a vertical width of a pixel region of the display substrate, and the second distance is about the same as an integer multiple of at least one of the horizontal width or the vertical width of the pixel region of the display substrate.

* * * * *